United States Patent
Blodgett

(10) Patent No.: US 11,463,051 B2
(45) Date of Patent: Oct. 4, 2022

(54) METHOD AND APPARATUS FOR ACHIEVING AND MAINTAINING BALANCE IN SOLID-STATE RF AND MICROWAVE POWER AMPLIFIERS

(71) Applicant: CACI, Inc.—Federal, Arlington, VA (US)

(72) Inventor: James R. Blodgett, Walnut Creek, CA (US)

(73) Assignee: CACI, Inc.—Federal, Reston, VA (US)

(*) Notice: Subject to any disclaimer, the term of this patent is extended or adjusted under 35 U.S.C. 154(b) by 119 days.

(21) Appl. No.: 17/066,732

(22) Filed: Oct. 9, 2020

(65) Prior Publication Data

US 2021/0281227 A1  Sep. 9, 2021

Related U.S. Application Data

(60) Provisional application No. 62/984,407, filed on Mar. 3, 2020.

(51) Int. Cl.
| | | |
|---|---|---|
| *H03F 3/68* | (2006.01) | |
| *H03F 1/02* | (2006.01) | |
| *H03F 3/21* | (2006.01) | |
| *H03G 3/30* | (2006.01) | |
| *H01P 5/19* | (2006.01) | |

(52) U.S. Cl.
CPC ............ *H03F 3/211* (2013.01); *H01P 5/19* (2013.01); *H03G 3/3042* (2013.01); *H03F 1/0288* (2013.01); *H03F 2200/451* (2013.01); *H03G 2201/103* (2013.01); *H03G 2201/307* (2013.01)

(58) Field of Classification Search
CPC .... H03F 3/211; H03F 2200/451; H03F 3/195; H03F 2200/192; H03F 2200/201; H03F 2200/204; H03F 2200/207; H03F 3/602; H03F 3/68; H03F 1/0288; H03F 3/607; H03F 3/60; H03F 3/54; H03F 1/36;
(Continued)

(56) References Cited

U.S. PATENT DOCUMENTS 7,054,597 B2 *  5/2006  Rosnell ................. H03F 1/0205
                                                       330/10
8,952,752 B1 *  2/2015  Huettner ............... H03F 1/3241
                                                       330/84
(Continued)

*Primary Examiner* — Khanh V Nguyen
(74) *Attorney, Agent, or Firm* — BakerHostetler; Tayan B. Patel

(57) ABSTRACT

This application is generally related to methods and systems for improving amplifier performance. For example, the system includes two or more gain and phase modulators. The system also includes two or more component amplifiers operably coupled to, and downstream of, the power splitter, where each of the two or more component amplifiers is operably coupled to a respective one of the two or more gain and phase modulators. The system further includes a power combiner operably coupled to, and downstream of, the two or more component amplifiers, configured to output a power signal. The system even further includes a Walsh generator configured to generate and transmit first and second Walsh codes to each of the two or more gain and phase modulators. The first Walsh code is orthogonal to the second Walsh code. A first set of the first and second Walsh codes is inverted with respect to a second set of the first and second Walsh codes.

19 Claims, 5 Drawing Sheets

(58) Field of Classification Search
CPC ....... H03F 3/3081; H01P 5/19; H03G 3/3042; H03G 2201/103; H03G 2201/307; H04B 3/06
USPC .......................... 330/53, 84, 124 R, 286, 295
See application file for complete search history.

(56) References Cited

U.S. PATENT DOCUMENTS

| | | | |
|---|---|---|---|
| 9,225,291 B2* | 12/2015 | Ahmed | H03F 1/0233 |
| 9,774,299 B2* | 9/2017 | Staudinger | H03F 1/3282 |
| 2003/0174018 A1* | 9/2003 | Cooper | H03F 3/211 |
| | | | 330/124 R |

* cited by examiner

METHOD AND APPARATUS FOR ACHIEVING AND MAINTAINING BALANCE IN SOLID-STATE RF AND MICROWAVE POWER AMPLIFIERS

CROSS-REFERENCE TO RELATED APPLICATIONS

This application claims the benefit of priority of U.S. Provisional application No. 62/984,407 filed Mar. 3, 2020, entitled "Method And Apparatus For Achieving And Maintaining Balance In Solid-State Rf And Microwave Power Amplifiers," the contents of which is incorporated by reference in its entirety.

FIELD

This application is generally related to solid-state radio frequency (RF) and microwave power amplifiers.

BACKGROUND

Large RF and microwave solid-state power amplifier systems generally include multiple components in various configurations. Isolated power combiners are employed to maintain isolation between these components, particularly in view of plural component amplifiers in large systems. The isolated power combiners include one or more terminating resistors to prevent the impact of the power of one component amplifier on the output of another component amplifier in the system. Achieving this ideal result, however, requires signals with the proper amplitude and phase values. These are most commonly implemented by employing identical component amplifiers or at least a means to adjust the amplitude and phase of the output signals. Otherwise, one or more terminating resistors in the power combiners absorbs a percentage of the power. In extreme cases, the absorption can reach 100%.

While low gain power amplifier systems may not experience as severe consequences when input and output powers of component amplifiers are not identical, this does not hold true for power amplifier systems with high gain and/or many tiers of combining component amplifiers. Varying manufacturing tolerances associated with plural component amplifiers contribute to very large differences in overall gain and phase of the component amplifiers causing degradation in linearity and efficiency. Absent some way to adjust, large amounts of power will be dissipated in one or more power combiners in the system.

Adjusting for optimal system performance in terms of amplifier gain and phase in complex amplifier systems poses a host of challenges. These challenges are further heightened by industry's desire to increase output power levels in view of size, weight and power (SWaP) considerations.

What is therefore desired in the art is a system, apparatus and method to achieve and maintain balance in large and/or high gain solid-state RF and microwave power amplifier.

What is further desired in the art is a system and apparatus that minimizes the number of components necessary in the system for achieving optimal power.

SUMMARY

The foregoing needs are met, to a great extent, by the disclosed apparatus, system and method for achieving and maintaining balance in solid-state RF and microwave power amplifiers.

One aspect of the application is directed to a system for optimizing power for amplification applications. The system also includes a power splitter. The system also includes two or more gain and phase modulators. The system also includes two or more component amplifiers operably coupled to, and downstream of, the power splitter, where each of the two or more component amplifiers is operably coupled to a respective one of the two or more gain and phase modulators. The system further includes a power combiner operably coupled to, and downstream of, the two or more component amplifiers, configured to output a power signal. The system even further includes a Walsh generator configured to generate and transmit first and second Walsh codes to each of the two or more gain and phase modulators. The first Walsh code is orthogonal to the second Walsh code. A first set of the first and second Walsh codes is inverted with respect to a second set of the first and second Walsh codes.

Implementations of this aspect may include one or more of the following features described below. For example, the power combiner may include a terminating resistor and a power detector. The power detector is configured to detect an absorbed power of the terminating resistor. The system may include a processor operably coupled to and downstream of the power combiner, the processor configured to perform the following actions. First, the processor may determine if the absorbed power meets a predetermined threshold of the system. Second, the processor may modulate the detected change in power. Third, the process may transmit the modulated power as a feedback to each of the two or more gain and phase modulators.

The processor, during modulation, is configured to multiply, via a means for multiplication, and obtain a product based on the first and second Walsh codes and the absorbed power during modulation. The processor, during modulation, is also configured to accumulate the product, via a means for accumulation, over a length of the first and second Walsh codes. The processor, during modulation, is further configured to add the accumulated product, via a means for summing, with the first set of the first and second Walsh codes. Further, the processor, during modulation, is configured to subtract the accumulated product, via a means for summing, with the second set of the first and second Walsh codes.

Another aspect of the application is directed to a method of optimizing power in high-gain power amplification systems. The method of optimizing power includes as step of receiving, at one or more power combiners, an output from two or more component amplifiers. The method also includes a step of detecting, at the one or more power combiners, a change in power based on the output of the two or more amplifiers. The method also includes a step of multiplying the detected change in power by each of a first and a second Walsh code spawned by a Walsh generator resulting in a product. Here, the first Walsh code is orthogonal to the second Walsh code. Moreover, a first set of the first and second Walsh codes is inverted with respect to a second set of the first and second Walsh codes. The method also includes a step of accumulating the product over a length of the first and second Walsh codes. The method even further includes a step of determining whether a result of the accumulation meets a predetermined threshold of the optimized power in the system.

Implementations of this aspect may include one or more of the following features. For example, the method may include a further step of adding, via a summer, the result of the accumulation to the first set of the first and second Walsh codes. The method may also include a step of transmitting feedback of the adding step to one of two or more gain and phase modulators located upstream of two or more component amplifiers in the system.

The method may even further include a step of subtracting, via a summer, the result of the accumulation to the second set of the first and second Walsh codes. The method may still even further include a step of transmitting feedback of the subtracting step to one of two or more gain and phase modulators located upstream of the two or more component amplifiers. In an embodiment, the determining step further includes checking the predetermined threshold associated with each of the two or more component amplifiers exhibits one or more of a +/−0.5 dB change in gain and a +/−2.5 degree change in phase. In other embodiments, much finer grain control may be used. This may include a +/−0.05 dB change in gain and a +1-0.5 degree change in phase.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF THE DRAWINGS

In order to facilitate a fuller understanding of the invention, reference is now made to the accompanying drawings, in which like elements are referenced with like numerals. These drawings should not be construed as limiting the invention and intended only to be illustrative.

DETAILED DESCRIPTION

Figure 1A:
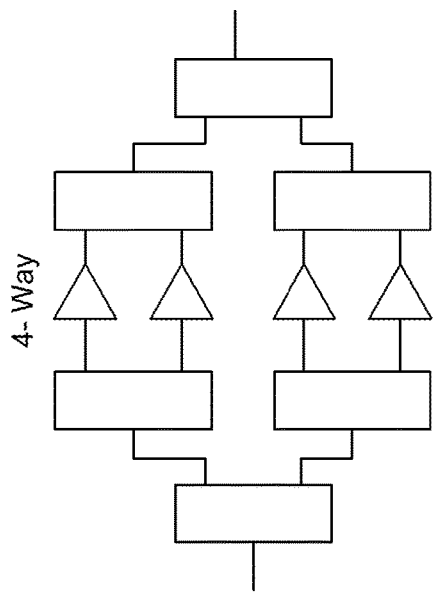
FIGS. 1A-C illustrate exemplary power combining architectures.

In this respect, before explaining at least one embodiment of the invention in detail, it is to be understood that the invention is not limited in its application to the details of construction and to the arrangements of the components set forth in the following description or illustrated in the drawings. The invention is capable of embodiments or embodiments in addition to those described and of being practiced and carried out in various ways. Also, it is to be understood that the phraseology and terminology employed herein, as well as the abstract, are for the purpose of description and should not be regarded as limiting.

Reference in this application to "one embodiment," "an embodiment," "one or more embodiments," or the like means that a particular feature, structure, or characteristic described in connection with the embodiment is included in at least one embodiment of the disclosure. The appearances of, for example, the phrases "an embodiment" in various places in the specification are not necessarily all referring to the same embodiment, nor are separate or alternative embodiments mutually exclusive of other embodiments. Moreover, various features are described which may be exhibited by some embodiments and not by the other. Similarly, various requirements are described which may be requirements for some embodiments but not by other embodiments.

It has been determined by the inventor, and fully described herein a system, architectures and methods that achieve and maintain balance in solid-state RF and microwave power amplifiers. The aspects of the instant invention may be employed in military and non-military applications. For example, the proposed technology can be used to improve systems and techniques directed to electronic warfare, high-power jamming systems, radar, macro-cell base stations, EMC testing, television transmitters, and particle accelerators. satellite base station transmitters, satellite radio (Sirius/XM) terrestrial repeaters According to an exemplary aspect of the application, an elegant solution is described for achieving balance in large RF and microwave power amplifier systems. Specifically, the exemplary architecture adjusts and maintains balance particularly with multiple tiers of power combining. The architecture achieves this technical effect continuously, automatically, and without imparting significant noise or impairment to the payload signal. In an exemplary embodiment, the architecture employs plural component amplifiers continuously operating in unison to effectuate a high-gain, high-power amplifier system. Additionally, the architecture includes minimal supplementary hardware to achieve the technical objectives discussed in the instant application.

Further, the architecture employs sophisticated algorithms and feedback loops to achieve balance in power amplification systems. The calculus behind the proposed techniques employed for the described large power amplifier systems are beyond what can be performed by the human mind. That is, the techniques require significant processing by a processor.

According to the present application, techniques proposed herein analyze power output of the power amplifier system including at least two component amplifiers. Preferably, at least four component amplifiers are in the system. More preferably at least eight component amplifiers are in the system. Variables affecting power output include one or more of temperature, voltage, frequency, load impedance, manufacturing tolerances, device variability and signal characteristics. In an exemplary embodiment, the interactions between component amplifiers and other devices in the amplifier system requires an iterative process to reach a minimum global noise and impairment of payload signal.

Figure 1C:
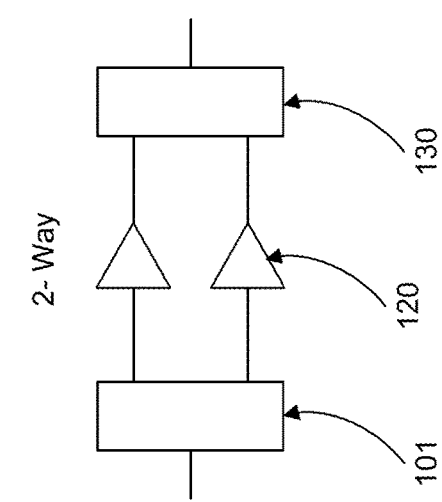
Figure 1B:
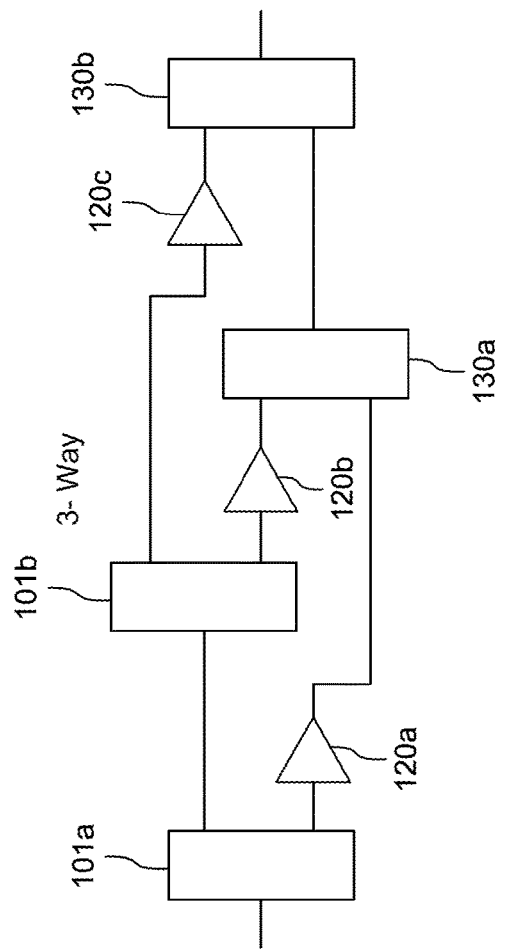

As described above, large RF and microwave solid-state power amplifiers are generally constructed using multiple devices or component amplifiers configured in various configurations. FIGS. 1A, 1B and 1C respectively illustrate exemplary power amplifiers. FIG. 1A illustrates a 2-way power amplifier system. FIG. 1B illustrates a 3-way power amplifier system. FIG. 1C illustrates a 4-way power amplifier system.

As illustrated in FIG. 1A, the 2-way power amplification system includes a power splitter 101 located upstream of two component amplifiers 120. The two component amplifiers 120 are located upstream of a power combiner 130. A final signal is output from the power combiner 130.

As illustrated in FIG. 1B (same reference indicators as FIG. 1A) the 3-way power amplifier system includes 2 power splitters 101a, 101b. Respective signals from power splitters 101a, 101b are located upstream of, and fed into, three component amplifiers 120a, 120b, 120c. Notably, a first output signal of power splitter 101a is fed to a first component amplifier 120a, and a second output signal is fed to the other power splitter 101b. Additionally, first and second output signals of power splitter 101b are fed to second and third component amplifiers 120b and 120c, respectively.

Figure 3:
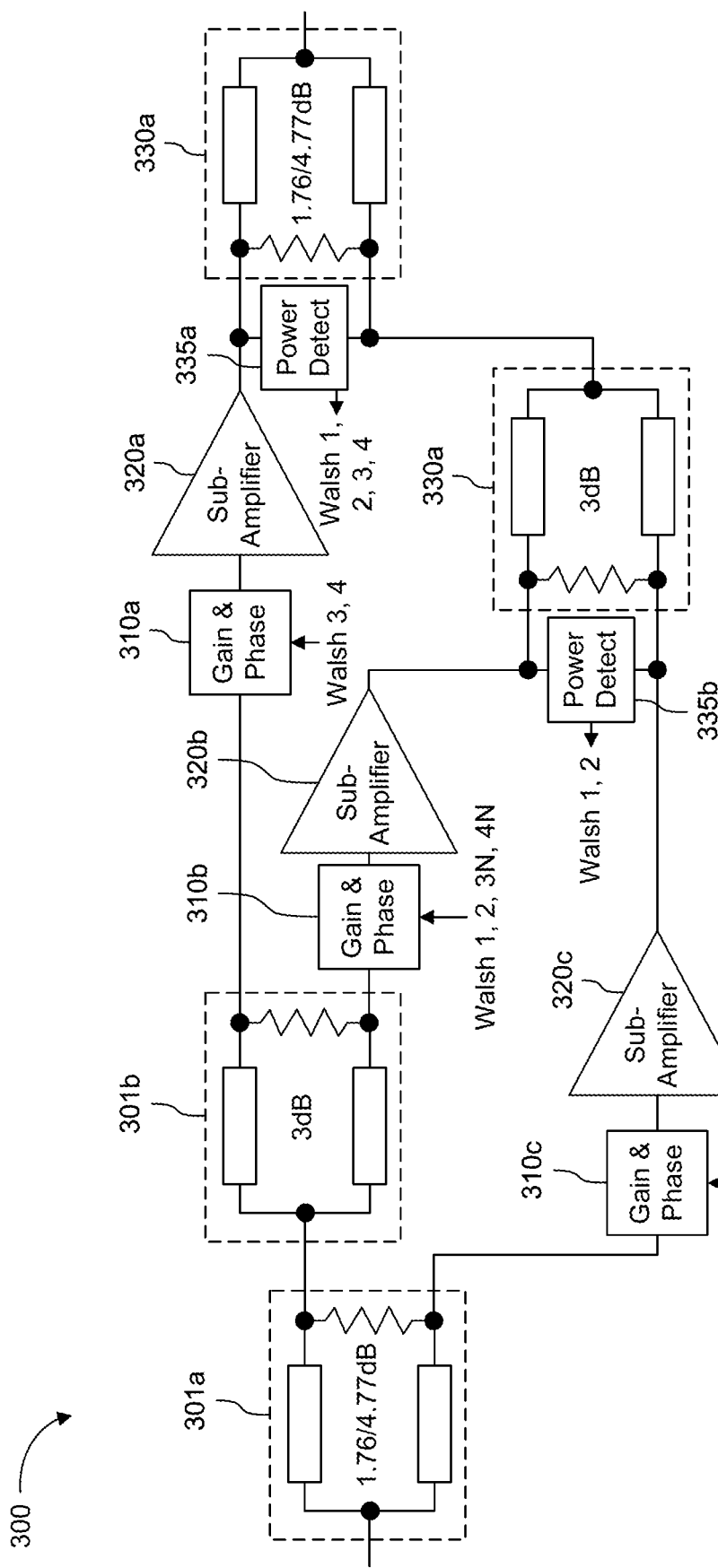
FIG. 3 illustrates a 3-way power amplifier system according to an aspect of the application.

Two power combiners 130a, 130b are located downstream of the three component amplifiers 120a, 120b, 120c. More specifically, output signals of the first and second component amplifiers are fed to power combiner 130a. An output signal of the third component amplifier 120c is fed to power combiner 130b. Power combiner 130b also receives an output signal of first power combiner 130a. For example, 3-way and higher power amplifier systems with an odd number of component amplifiers is architecturally designed by a specific ratio. Namely, this ratio of 2:1:2 codifies the ratio of power splitters, component amplifiers and power combiners in the amplification system. FIG. 3 further illustrates an embodiment of the 3-way amplification system and will be described in more detail below.

Although the examples shown in the figures include splitters and combiners with 2 ports for outputs and inputs, respectively, other varieties may have an arbitrary number, i.e., 2, 3, 4, 5, 6, 7 . . . . N. It is envisaged that multi-port combiners are made up internally with combinations of 2 port combiners. For instance, 3-port combiners are relatively common. i with a 3-port splitter feeding 3 amplifiers into a 3-port combiner.

As illustrated in FIG. 1C (same main reference indicators as FIGS. 1A and 1B) a 4-way power amplifier system includes 3 power splitters, 4 component amplifiers and 3 power combiners. Ultimately, the ratio of power splitters to component amplifiers in a 4-way power amplification system is 3:4. Similarly, the ratio of power combiners to component amplifiers in the 4-way power amplification system is 3:4. Hence the overall ratio of power splitters, component amplifiers and power combiners in a 4-way power amplification system is 3:4:3.

Exemplary component amplifiers are at least manufactured by CACI and Amplifier Research Corporation. Exemplary power combiner types are at least manufactured by Wilkinson, Geysel, Branchline, and Lange. Generally, these power combiners have one or more terminating resistors preventing power from one component amplifier to affect output of another component amplifier. Stated differently, a signal applied to an input port will only flow to the output port. All power will sum at the output provided the input signals have the proper amplitude and phase relative to the split ratio of the combiner. This requires component amplifiers to be identical, or alternatively, have other means to adjust the amplitude and phase of the output signals. If the input signals to the combiner do not have the proper amplitude and phase, the terminating resistor(s) will absorb some percentage of the power. This may have an upper bound of 100% in the extreme cases. The comment above is due to the fact that architectures that use unequal split splitters and combiners will not have the same amplitude at each port.

In power amplifier systems having high gain and/or many tiers of combining, the manufacturing tolerances involved may result in very large differences in overall gain and phase of the component amplifiers. Absent some means for adjustment, linearity and efficiency will be degraded. As a result, large amounts of power will be dissipated into the combiner. Adaptive control of the power amplification system is required. Adaptive control may be necessary. According to another aspect of the application, a method and apparatus are described for the simultaneous, automatic and continuous adjustment of an unlimited number of parameters to achieve the best balance and performance of an amplifier consisting of multiple paralleled component amplifiers. The architecture achieves these results without impairing payload signal, and effectively deals with variations due to temperature, voltage, signal characteristics, load impedance and other parameters.

Figure 2:
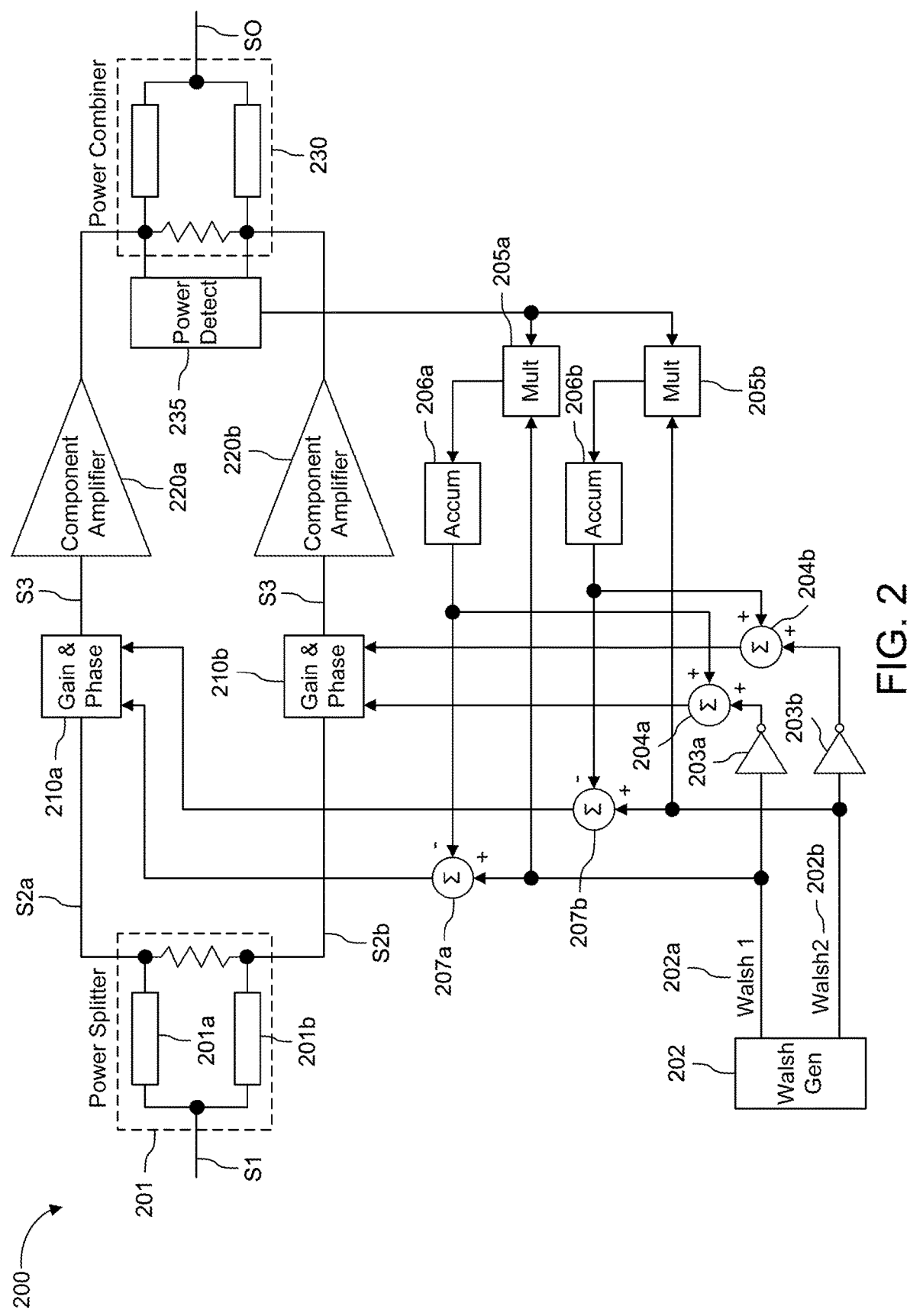
FIG. 2 illustrates a 2-way power amplifier system according to an aspect of the application.

FIG. 2 depicts an exemplary embodiment of the invention portraying a 2-way power amplification system 200. Here, a signal S1 is received at a power splitter unit 201 of the power amplification system 200. In this embodiment, there are two power splitters 201a, 201b. The power splitter 201 also includes a resister located between power splitters 201a, 201b.

S1 is split and independently fed to power splitters 201a, 201b. Signals S2a, S2b are output from power splitters 201a, 201b, respectively. S2a, S2b are fed to respective downstream gain and phase modulators 210a, 210b. The gain and phase modulators 210a, 210b may be the combination of a phase shifter and an attenuator. Alternatively, the gain and phase modulators 210a, 210b may be a vector modulator driven by sin and cosine signals controlling phase and gain. In one embodiment, the gain and phase modulators 210a, 210b are located within a single device. In an alternative embodiment, the gain and phase modulators may be separate and operably coupled to one other in a subsystem.

Signals S2a, S2b are subsequently fed to respective component amplifiers 220a, 220b. Then, the amplified signals S2a, S2b are fed to a power combiner unit 230. The power combiner unit 230 combines amplified signals S2a, S2b via two power combiners 230a, 230b located therein. In an embodiment, power combiners 230a, 230b are in-phase and equal in magnitude.

In another embodiment, power combiner unit 230 includes one or more grounded termination resistors. The power at the termination resistor approaches zero when the component amplifiers approach perfect balance. As a result, a very sensitive method to determine the optimum settings achieved by the power amplification system 200. Alternatively, power could be measured at an output of the power combiner unit 230 with adjustments made to maximize power.

In yet another embodiment, power combiner unit 230 includes a power detector 235 configured to detect power absorbed by the termination resistor. Ultimately, a combined signal SO is output from power combiners 230a, 230b. Preferably, the power combiner unit 230 digitizes signal SO.

According to a further embodiment, power amplification system 200 may also include a processor and controller operably coupled to the gain and phase modulators 210a, 210b. Here, the processor and controller may include a Walsh generator 202 configured to provide balance to the power amplification system 200. Alternatively, the system 200 can include a separate, standalone controller including a Walsh code generator, signal processor, and control circuits. The Walsh generator 202 operates in accordance with known principles to one skilled in the art.

As depicted in FIG. 2, the Walsh generator 202 generates first and second Walsh codes 202a, 202b and transmits both Walsh codes to each gain and phase modulator 210a, 210b. Specifically, generated Walsh codes 202a, 202b are orthogonal to one another. And one set of the Walsh codes is inverted in relation to another set of Walsh codes. As exemplarily shown in FIG. 2, inverters 203a, 203b are located between Walsh generator 202 and gain and phase modulator 210b. Alternatively, the invertors 203a, 230b may be located between Walsh generator 202 and gain and phase modulator 210a.

The amplitudes of the Walsh codes 202a, 202b are very small and impart slight variations to the phase and amplitude of the signals applied to the component amplifiers. Importantly, the effect of the Walsh codes on one component amplifier, e.g., 220a, causes a gain and phase change in one direction, while the effect of the inverse Walsh codes on the other component amplifier, i.e., 220b, causes gain and phase changes in the other direction. Therefore, the effect on the signal output SO leaving the power combiner unit 230 will be minimal. In an exemplary embodiment, when the amplifier is in a balanced state, either a +/−0.5 dB change in component amplifier gain or a +/−2.5 degree change in phase will produce less than a 0.01 dB change in overall output power with no change in phase.

These same changes however will have a very large effect on the power absorbed by the combiner's termination resistor. For example, when the initial balance is sufficient to keep the dissipated power in the termination resistor to 30 dB below that of the output power, a component amplifier gain change of +/−0.5 dB or a phase change of +/−2.5 degrees will yield power changes at the termination resistor of roughly 5 dB. Very small gain and phase changes can be made in this differential fashion that have virtually no effect on the output signal when the amplifier is balanced, and still be detected easily with high sensitivity at the termination resistor.

In addition to the benefits noted above for differential adjustment of gain and phase of the component amplifiers, the architectures and methods described herein also prevent driving both component amplifier gains to a minimum ultimately causing a minimum at the terminating resistor. Likewise, power measured at the output will prevent driving both component amplifier gains to a maximum causing a maximum at the output SO. Either case is indicative of the amplifier being unbalanced and not optimally configured.

The power detector 235 communicates with the terminating resistor of the power combiner unit 230. Power detector 235 will detect any change in power. The power detector 235 may operably be coupled to a downstream digital signal processor (DSP) or other processor, or alternatively include a DSP or other processor therein, to modulate the detected power when a variation is observed. Namely, the DSP can synchronously multiply, employing multipliers or multiplier functionalities 205a, 205b, the individual Walsh codes. The multiplied variation is then accumulated, employing accumulators or accumulator functionalities 206a, 206b, over the length of the code.

Non-zero results are indicative of the component amplifiers being in imperfect balance. In such instance, the non-zero results are used as feedback to drive the loop in the direction of best balance. More specifically as shown in FIG. 2, the non-zero results are subtracted, at summers or summer functionalities 207a, 207b, and fed back to gain and phase modulator 210a. Moreover, the non-zero results are added, at summer or summer functionalities 204a, 204b, to gain and phase modulator 210b. Since the individual Walsh codes are orthogonal, adjustment of gain and phase occurs simultaneously. Hence, a global optimized balance in the power amplification system is quickly reached without an iterative approach.

The maximum loop bandwidth is bounded by the length of the Walsh codes and the speed at which the attenuators and phase shifters can be controlled. These functions may be performed in a DSP or a similar processor.

In an alternative embodiment, other orthogonal codes may be used or non-orthogonal sequences such as shifted versions of a pseudo-noise code. Here, longer integration times are required since the shifted codes are not truly orthogonal. Very long codes are needed to avoid a residual offset. Walsh codes are ideal because they are easily generated, can be any desired length, and when multiplied with other codes in the same series yields zero accumulated output regardless of the code's length.

According to a further embodiment of the application, FIG. 3 illustrates a 3-way power amplification system 300 with power values in decibels (dB) included for power splitters 301a, 301b and power combiners 330a, 330b. Generally, in 3-way and higher power amplifier systems with an odd number of component amplifiers, a ratio of 2:1:2 is preferred in connection with the power splitters, component amplifiers and power combiners, respectively. As depicted in FIG. 3, the power splitter 301a exhibits the same power ratio (dB) as power combiner 330a. Moreover, power splitter 301b exhibits the same power ratio (dB) as power combiner 330b.

In this configuration, splitters 301a and 330a are not equally split. Specifically, one splitter exhibits power of −1.76 dB while the other splitter exhibits power of −4.77 dB. Namely, one port sources or sinks ⅓ of the total power and the other port sources or sinks ⅔ of the total power. The signal levels should reflect this relationship.

Thus for splitter 301a, the top port is −1.76 dB (⅔ in power) because it feeds a pair of two amplifiers (320a and 320b) through splitter 301b. This is ⅔ of the total power because it is 2 out of the 3 amplifiers. The lower port of 301a exhibits power of −4.77 dB (⅓ the power) and feeds a single amplifier (320C). The combining is exactly the opposite. Here, the output signal levels at 301a and the input signals 330a are not equal. One, 1 splitter represents ⅔ of the power and the other ⅓ splitter of the power. The splitter and combiner are configured to match that ratio, with the net result being all power exiting the output port and none burned up in the terminating resistors. It is appreciated in this application that configurations using equal ratio splitters and combiners are easier to understand because the signal levels at the splitters and the combiners are the same. Nevertheless the teachings proposed above are the same.

Figure 4:
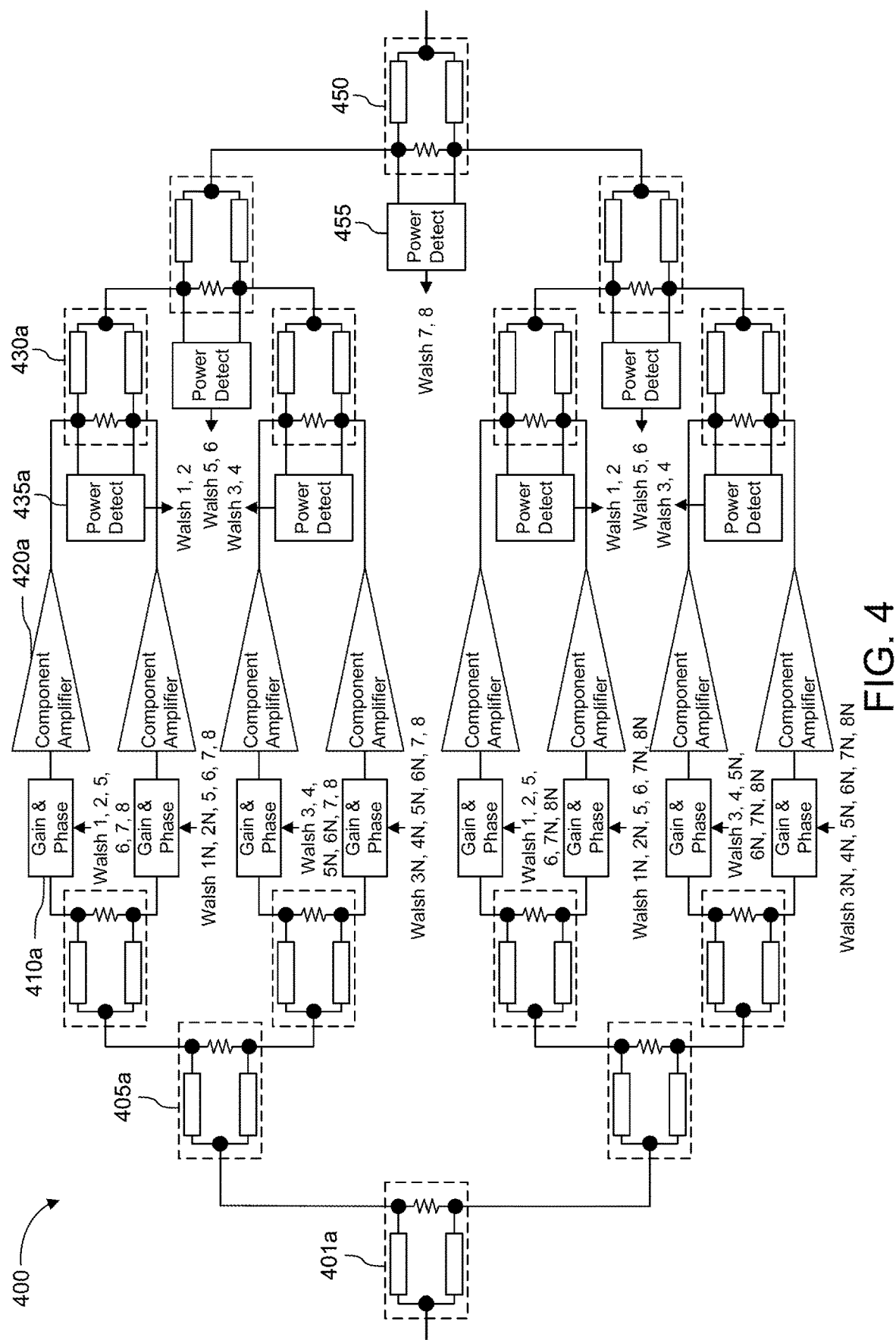
FIG. 4 illustrates an 8-way power amplifier system according to an aspect of the application.

According to yet even another embodiment of the application, FIG. 4 illustrates an 8-way power amplification system 400. The 8-way power amplification system 400 includes an initial power splitter 401, intermediate power splitters 405a (405b-405g not labeled), gain and phase modulators 410a (410b-410h not labeled), component amplifiers 420a (420b-420h not labeled), intermediate power detectors 435a (435b-435f), intermediate power combiners 430a (430b-g not labeled), final power detector 455, and final power combiner 450. Naturally, an even numbered power amplification system that is 4-way or higher power amplification system exhibits a ratio of 3:4:3 with respect to total number of power splitters, component amplifiers and total power combiners. For simplicity, the 8-way power amplification system 400 shown in FIG. 4, does not show the Walsh generator, inverters, multipliers, accumulators and summing junctions for simplicity. The gain and phase modulators 410a-h and component amplifiers 420a-h are similar in design as described above in FIG. 2.

Importantly, there is only one gain and phase modulator for every component amplifier as shown in the embodiment in FIG. 4. In other words, a 1:1 ratio for gain and phase modulators and component amplifiers is preferred for power amplification systems with an even number of component amplifiers. The gain and phase modulators match individual pairs of component amplifiers. The gain and phase modulators also match pairs of the individual pairs of component amplifiers. Additional gain and phase modulators therefore are not required for each tier of power splitting and combining in the system. As a result, overall gain and phase of the complete system can be controlled when global gain and phase control inputs are summed with the Walsh codes.

In FIG. 4, each tier of power combination has a unique pair of Walsh codes and their inverses are summed with the Walsh codes of other tiers. This is performed prior to being fed to the gain and phase modulators 410a-410h. In this embodiment, the system 800 includes eight Walsh codes and their inverses. With each 2-way combination, the termination resistor power is measured, multiplied by the respective Walsh codes, and accumulated. Thereafter the results are subtracted or added to the feedback as required to drive the loops towards best balance. While interactions between component amplifiers is possible in view of less than ideal power combiners and gain and phase modulators (including phase shifters and attenuators), the simultaneous characteristics of the Walsh code algorithm minimizes these effects to achieve best overall power amplifier balance in the shortest amount of time.

According to yet a further embodiment of the application, in cold start conditions, the initial gain and phase of the component amplifiers may be far from their final or desired values. Although, it should mathematically be possible to simultaneously achieve convergence of all loops, it may be advantageous to sequentially converge the loops. Sequential convergence of the loops involves beginning from the inner tiers of the system and ending with the outer tiers. Once convergence is achieved, all loops may simultaneously be run and maintained for best balance of all stages irrespective of temperature, voltage, signal level or signal characteristics. For any stored convergence values, any subsequent start-ups may immediately be performed with all loops running simultaneously.

According to yet even a further embodiment, the power combiners are envisaged to be zero degree (in-phase), 180-degree, 90-degree, arbitrary phase, and combinations thereof. Similarly, the amplitude of the power combiners may also be different.

Figure 5:
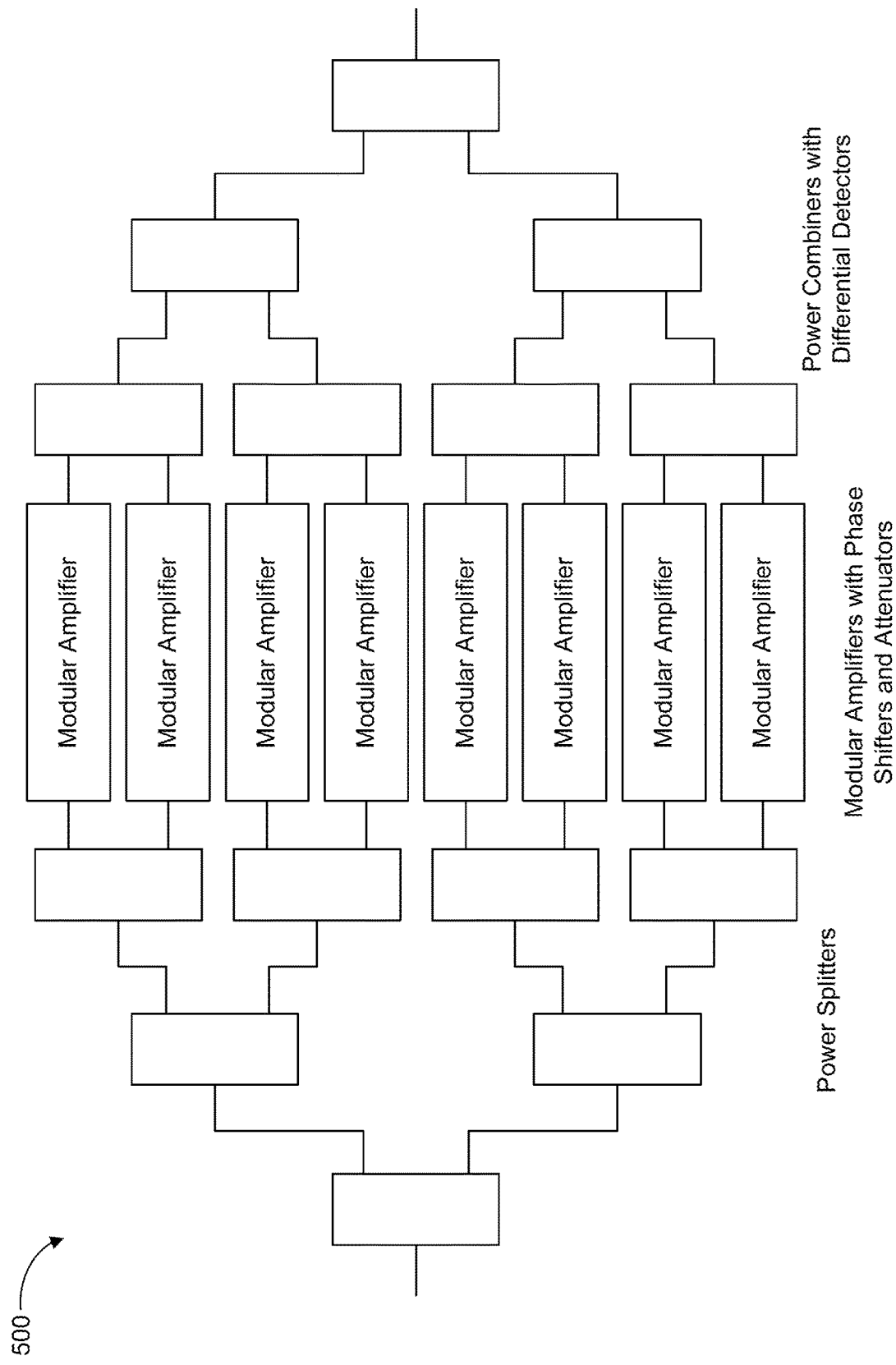
FIG. 5 illustrates an exemplary 8-way modular power amplifier system according to another aspect of the application.

According to another aspect of the application, a module architecture is shown in the exemplary embodiment depicted in FIG. 5. FIG. 5 is envisaged apart from the single integrated unit depicted in FIG. 4. Namely, individual, high-gain, high-power amplifiers may be combined with little concern for: (i) amplifier-to-amplifier differences in gain and phase, (ii) differences in splitter and combiner loss and phase; and/or (iii) differences in connecting cable loss or length. Total delay variations through the system will still need to be kept within reasonable limits to maintain acceptable instantaneous bandwidth. Even if delay differences are substantial the adaptive system can adjust when large frequency changes are made.

The modular amplifier system illustrated in FIG. 5 is architecturally the same as the amplifier shown in FIG. 4. Specifically, ordinary passive 2-way power splitters are used at the input. The power output combiners are 2-way with detectors built in. As an example, the individual amplifiers are high gain (perhaps 50 to 60 dB) and high output power (500 Watts for instance). When the configuration includes eight amplifiers cabled together, the combined output power can approach 4 kW adaptive control. With such high-gain, high-power amplifiers, doing this without adaptive control to keep the amplifiers in balance would be problematic.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

What is claimed is:

1. A system comprising:
 a power splitter;
 two or more gain and phase modulators;
 two or more component amplifiers operably coupled to, and downstream of, the power splitter, where each of the two or more component amplifiers is operably coupled to a respective one of the two or more gain and phase modulators;
 a power combiner operably coupled to, and downstream of, the two or more component amplifiers, configured to output a power signal; and
 a Walsh generator configured to generate and transmit first and second Walsh codes to each of the two or more gain and phase modulators, where the first Walsh code is orthogonal to the second Walsh code, and where a first set of the first and second Walsh codes is inverted with respect to a second set of the first and second Walsh codes.

2. The system of claim 1, wherein the power combiner includes a terminating resistor and a power detector, wherein the power detector is configured to detect an absorbed power of the terminating resistor.

3. The system of claim 2, further comprising a processor operably coupled to and downstream of the power combiner, the processor configured to:
 determine if the absorbed power i-s-meets a predetermined threshold of the system;
 modulate the detected change in power; and
 transmit the modulated change in power as a feedback to each of the two or more gain and phase modulators.

4. The system of claim 3, wherein the processor, during modulation, is configured to multiply, via a means for multiplication, and obtain a product based on the first and second Walsh codes and the absorbed power during modulation.

5. The system of claim 4, wherein the processor, during modulation, is configured to accumulate the product, via a means for accumulation, over a length of the first and second Walsh codes.

6. The system of claim 5, wherein the processor, during modulation, is configured to add the accumulated product, via a means for summing, with the first set of the first and second Walsh codes.

7. The system of claim 5, wherein the processor, during modulation, is configured to subtract the accumulated product, via a means for summing, with the second set of the first and second Walsh codes.

8. The system of claim 1, wherein a total number of the power splitters is one less than a total number of the component amplifiers in the system.

9. The system of claim 1, wherein a total number of the power combiners is one less than a total number of the component amplifiers in the system.

10. The system of claim 1, wherein
 the Walsh generator is configured to generate and transmit third and fourth Walsh codes to each of third and fourth gain and phase modulators,
 the third Walsh code is orthogonal to the fourth Walsh code, and a first set of the third and fourth Walsh codes is inverted with respect to a second set of the third and fourth Walsh codes.

11. A method of optimizing power in a system comprising:
receiving, at one or more power combiners, an output from two or more component amplifiers;
detecting, at the one or more power combiners, a change in power based on the output of the two or more amplifiers;
multiplying the detected change in power by each of a first and a second Walsh code spawned by a Walsh generator resulting in a product, where
the first Walsh code is orthogonal to the second Walsh code, and
a first set of the first and second Walsh codes is inverted with respect to a second set of the first and second Walsh codes;
accumulating the product over a length of the first and second Walsh codes; and
determining whether a result of the accumulation meets a predetermined threshold of the optimized power in the system.

12. The method of claim 11, further comprising:
adding, via a summer, the result of the accumulation to the first set of the first and second Walsh codes.

13. The method of claim 12, further comprising:
transmitting feedback of the adding step to one of two or more gain and phase modulators located upstream of two or more component amplifiers in the system.

14. The method of claim 12, further comprising:
subtracting, via a summer, the result of the accumulation to the second set of the first and second Walsh codes.

15. The method of claim 14, further comprising:
transmitting feedback of the subtracting step to one of two or more gain and phase modulators located upstream of the two or more component amplifiers.

16. The method of claim 15, wherein the determining step further includes checking the predetermined threshold associated with each of the two or more component amplifiers exhibiting one or more of a +/−0.5 dB change in gain and a +/−2.5 degree change in phase.

17. The method of claim 11, wherein a total number of the one or more power combiners is one less than a total number of component amplifiers in the system.

18. The method of claim 17, wherein a total number of power splitters is one less than a total number of the component amplifiers in the system.

19. The method of claim 11, wherein a ratio of a total number of power splitters, component amplifiers and power combiners in the system, respectively, is 3:4:3.

* * * * *